(12) United States Patent
Bindell et al.

(10) Patent No.: US 6,250,143 B1
(45) Date of Patent: Jun. 26, 2001

(54) METHOD OF MAPPING A SURFACE USING A PROBE FOR STYLUS NANOPROFILOMETRY HAVING A NON-CIRCULAR CROSS-SECTION

(75) Inventors: Jeffrey B. Bindell; Erik C. Houge, both of Orlando; Larry E. Plew, St. Cloud; Terri L. Shofner, Casselberry; Frederick A. Stevie, Orlando, all of FL (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/386,711

(22) Filed: Aug. 31, 1999

Related U.S. Application Data

(60) Provisional application No. 60/144,105, filed on Jul. 16, 1999.

(51) Int. Cl.$^7$ .................................................. G01H 23/00
(52) U.S. Cl. ........................ 73/105; 73/1.89; 216/11; 250/306; 250/307
(58) Field of Search ........................... 73/104, 105, 1.89; 216/11; 250/305, 306, 307

(56) References Cited

U.S. PATENT DOCUMENTS

| | | | |
|---|---|---|---|
| Re. 36,488 | * | 1/2000 | Elings et al. ........................... 73/105 |
| 5,210,425 | * | 5/1993 | Delawski et al. ..................... 250/307 |
| 5,242,541 | * | 9/1993 | Bayer et al. ............................ 216/11 |
| 5,362,685 | * | 11/1994 | Gardner et al. ....................... 437/238 |
| 5,497,656 | * | 3/1996 | Kado et al. ............................. 73/105 |
| 5,665,905 | * | 9/1997 | Bartha et al. ........................... 73/105 |
| 5,846,870 | * | 12/1998 | Ishida et al. .......................... 438/398 |
| 6,091,124 | * | 7/2000 | Bayer et al. ............................. 73/105 |
| 6,091,248 | * | 7/2000 | Hellemans et al. ................... 250/306 |

OTHER PUBLICATIONS

Howard, L. P. and Smith, S. T. Rev. Sci. Instrum. 63(10) 1993, pp. 4289–4295.*

* cited by examiner

*Primary Examiner*—Hezron Williams
*Assistant Examiner*—Michael Cygan

(57) ABSTRACT

The present invention provides an apparatus and a method of manufacturing that apparatus. More specifically, to a method of manufacturing probes for a stylus nanoprofilometer having a non-circular probe tip geometry and a method of measurement of semiconductor wafer features using the same. In one embodiment, the probe comprises an upper portion couplable to the stylus nanoprofilometer and a probative portion coupled to the upper portion. The probative portion has a cross section that is substantially thinner than a cross section of the upper portion. The probative portion further has a terminus distal the upper portion and a reentrant angle from the terminus to the upper portion.

12 Claims, 10 Drawing Sheets

FIG. 5A
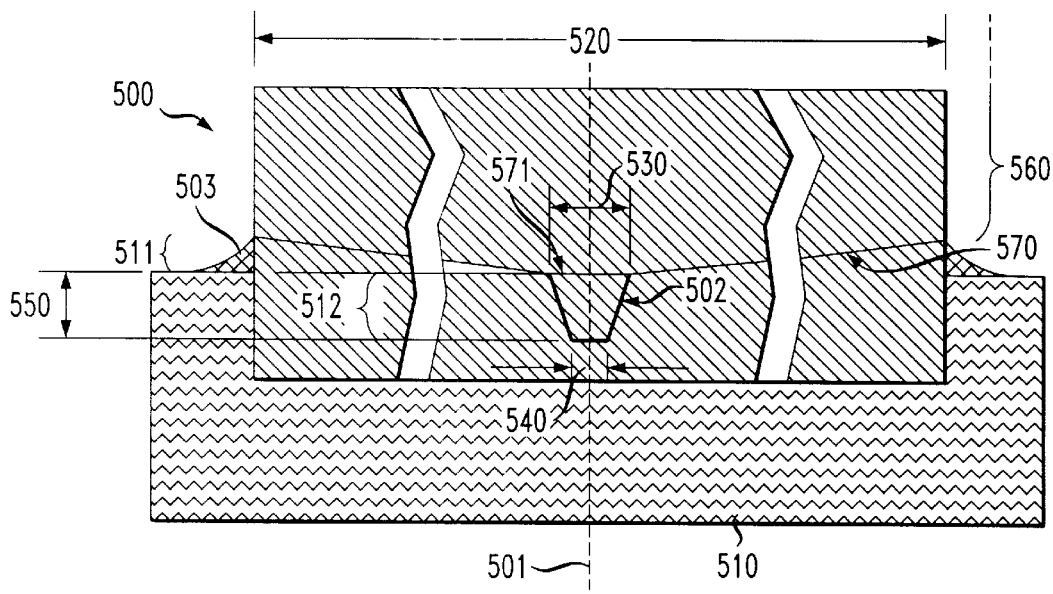
FIG. 5B
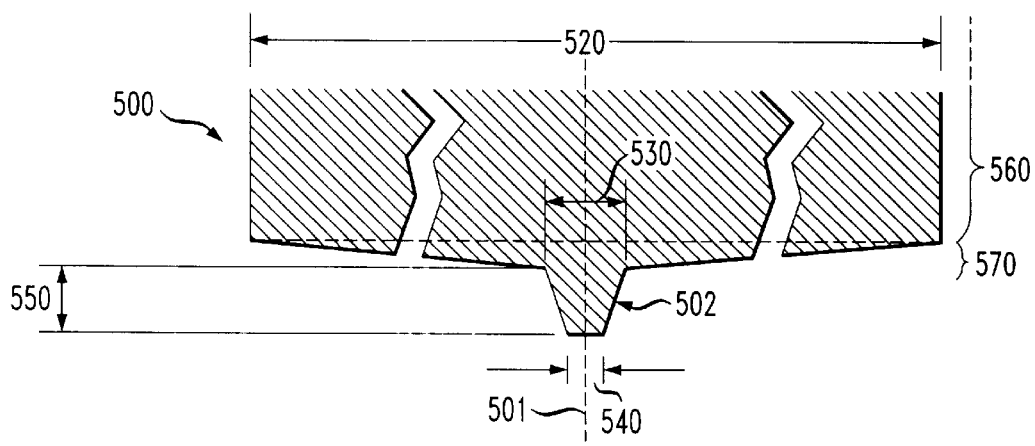
FIG. 6
| SOLUTION A | SOLUTION B |
|---|---|
| 41 ml 6:1 BOE<br>9 ml HF (49%)<br>5ml ACETIC ACID (99.8%)<br>15 ml $H_2O$ | 5 PARTS 6:1 BOE<br>5 PARTS HF (49%)<br>1 PART ACETIC ACID (99.8%) |

FIG. 10A
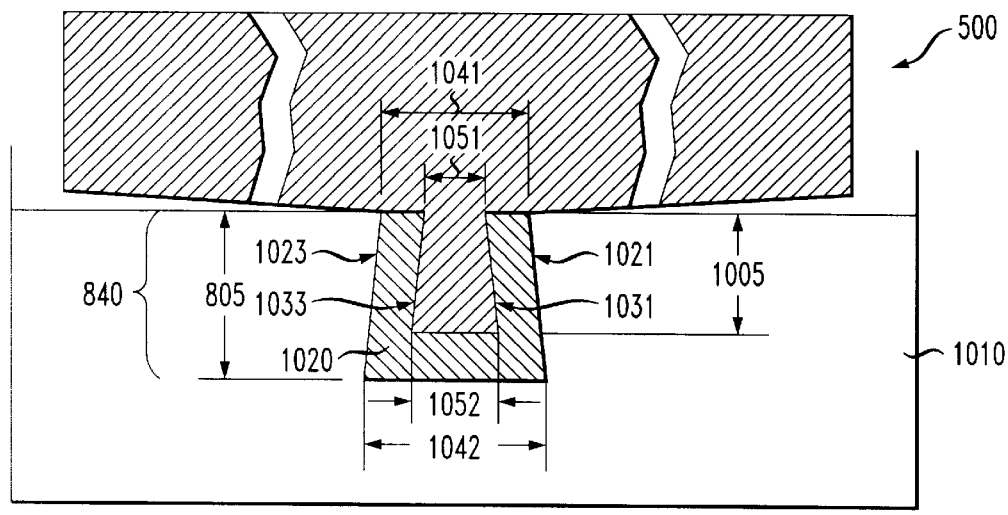
FIG. 10B
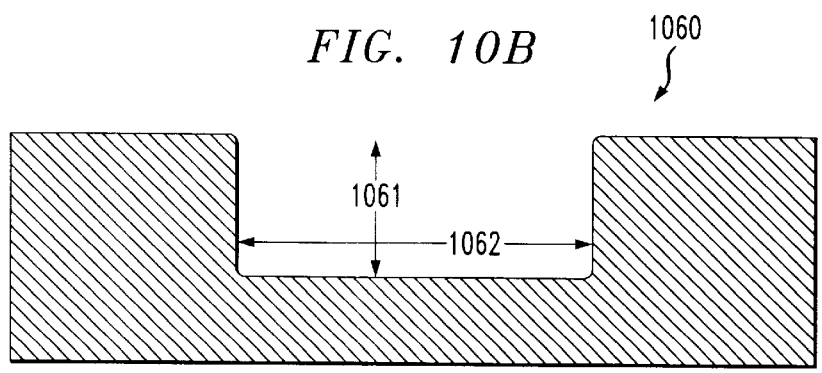
FIG. 11
| SOLUTION C | SOLUTION D | SOLUTION E | SOLUTION F |
|---|---|---|---|
| 5 PARTS BOE<br>1 PART HF<br>1 PART ACETONE | 5 PARTS BOE<br>1 PART HF<br>1 PART ACETONE<br>7 PARTS DEIONIZED $H_2O$ | 5 PARTS BOE<br>1 PART HF<br>1 PART ACETONE<br>14 PARTS DEIONIZED $H_2O$ | 5 PARTS BOE<br>1 PART HF<br>1 PART ACETIC ACID<br>3 PARTS DEIONIZED $H_2O$ |

METHOD OF MAPPING A SURFACE USING A PROBE FOR STYLUS NANOPROFILOMETRY HAVING A NON-CIRCULAR CROSS-SECTION

CROSS-REFERENCE TO PROVISIONAL APPLICATION

This application claims the benefit of U.S. Provisional Application No. 60/144,105 entitled "Probe for Stylus Nanoprofilometry and Method of Manufacture Thereof," to Bindell, et. al., filed on Jul. 16, 1999, which is commonly assigned with the present invention and incorporated herein by reference as if reproduced herein in its entirety.

TECHNICAL FIELD OF THE INVENTION

The present invention is directed, in general, to a semiconductor feature measurement apparatus and a method of manufacturing that apparatus and, more specifically, to a method of manufacturing probes for a stylus nanoprofilometer having a non-circular probe tip morphology and to a method of measurement of semiconductor wafer features using the same.

BACKGROUND OF THE INVENTION

As line widths and features within the semiconductor industry continue to decrease in size there is an ever-increasing need to discover new ways and tools to accurately define the size and shape of the features in a microcircuit. Critical dimensions and accurate formation of various devices within an integrated circuit are paramount in producing high quality semiconductor devices, and the scanning electron microscope (SEM) has long been an industry standard for examining such features. The SEM uses a very fine probing beam of electrons that sweeps over the surface of the specimen causing the surface to emit a variety of radiations. Measuring the radiation creates a signal that is proportional to the amount of radiation leaving an individual point of the specimen at any instant. This signal can be used to modulate the brightness of a display cathode-ray tube (CRT) as an illumination beam rests on a corresponding pixel of the CRT image. In practice, the pixels follow one another with great rapidity so that the image of each pixel becomes an image of a line, and the line, in turn, becomes a series of lines that move down the screen so rapidly that the human eye sees a complete image. The CRT image can also be recorded in its entirety by allowing the pixel-by-pixel information to build up in sequence on a photographic film.

As semiconductor features continue to decrease in size, now reaching less than 200 nm and projected to reach to about 120 nm, it is becoming increasingly important to have the ability to measure the actual features formed on a semiconductor wafer. The SEM has historically been an excellent analytical tool for determining the nature, width, and length of features on the upper surface of a semiconductor die. In the early 1990's the SEM was adequate for detailed feature analysis because feature size was on the order of 500 nm and larger. As feature sizes continue to decrease, the exact nature of the sidewall becomes increasingly important. However, a SEM beam that is vertical, i.e., with respect to the die surface, has significant difficulty in determining the depth of some features in today's sub-250 nm feature sizes.

To illustrate the problem of a vertical SEM on a very small surface, refer initially to FIG. 1. Illustrated is a sectional view of one embodiment of a simple semiconductor wafer feature 100 being subjected to a vertical electron beam, collectively 105, of a SEM (not shown). The illustrated semiconductor wafer feature 100 comprises, a first upper surface 111, a lower surface 120, first and second sides 131, 132, and a second upper surface 112. The first and second sides 131, 132 are shown as they are typically found. That is, the sides 131, 132 are not exactly vertical, but rather slightly outward sloping (note angles 131a and 132a), with respect to the lower surface 120. In prior years, the wall slope, i.e., typically angles 131a, 132a of perhaps 0.5 to 3 degrees off the vertical, of channel features was known, but was not significant when considered against a total width 101 and depth 102 of the feature 100.

While the planar location (x and y coordinates) of any point on a surface of a feature can readily be ascertained from the stepper mechanism that operates the electron beam 105, the vertical location (z coordinate) of the point may be problematic. As the vertical electron beam 105 of a SEM passes from left to right, i.e. passes through positions 105a through 105m sequentially, the first upper surface 111 is readily defined by the beam 105 at positions 105a through 105c. However when the electron beam 105 passes over the first side 131, that is, from 105d through 105f, there can be an uncertainty as to the depth of the surface 131 being impacted by the electron beam 105. An edge effect causes secondary electrons 106 to be generated when the electron beam 105d, 105e strikes a corner 133 of sloping first side 131 and causes what is called a "blooming effect" in the image. As with the first upper surface 111, the lower surface 120 is readily discerned by the electron beam 105g–105i, but the blooming effect re-occurs on the second side 132 at positions 105j through 105l. This disrupts how finely the sidewall 131, 132 depth can be determined. With wall slopes as mentioned, the morphology of the wall where the electron beam 105 is striking becomes clouded as the secondary emission 106 of electrons from the target blooms. It therefore becomes uncertain as to the exact shape and dimensions of the side walls 131, 132.

Thus, a vertical SEM is limited in usefulness for analyzing an existing feature. To effectively use the SEM for feature depth measurements, the semiconductor die must be sectioned, allowing SEM to be performed on the section, rather than vertically from the upper surface. This allows what could be termed a horizontal SEM, i.e., a SEM oriented into the plane of FIG. 1. However, sectioning results in destruction of the wafer, and is therefore undesirable.

Another negative factor with SEM examination is that it charges the surface being examined, that is, electrons are bombarded onto the surface of the sample, and secondary emissions from the target are then measured. Thus, the scanning electron microscope has about reached its limit in its ability to provide information on the semiconductor features being formed today. Therefore, one might reasonably prefer to have a non-intrusive examination method that does not interact with the sample or its surface.

In light of the aforementioned problems, one approach to a solution might be to use a physical measurement system, bypassing the intrusive nature of the SEM, as well as eliminating a need for sectioning the semiconductor die. One such existing tool is a stylus nanoprofilometer (SNP), also know as a critical dimension atomic force microscope (CDAFM). Referring now to FIG. 2, illustrated is a schematic representation of a conventional, single-direction balance beam force sensor 200. The SNP (not shown) uses the balance beam force sensor 200 to monitor a force 215 between a probe tip or stylus 210 and a sample surface 220. Additional information on balance beam force sensors may be obtained in "Dimensional Metrology with Scanning Probe Microscopes", Journal of Vacuum Science and Technology Bulletin 13, pg 1100, pub. 1995, incorporated herein by reference. By monitoring a change in capacitance at locations 251, 252 between a scan actuator 230 and a balance beam 240, contact with the surface 220 can be detected. Referring now to the enlarged view, by moving the probe tip 210 from point to point on the sample surface 220, one who is skilled in the art will readily understand that the topography of the surface 220 can be mapped.

Of course, different problems present themselves when using physical means, rather than a SEM, for device measurements. For critical dimension measurements, the shape of a mechanical probe tip, which is of course a finite size, must be extracted from the obtained data. Therefore, mechanical probe tips must be: (a) made so that they are easily characterized, and (b) have only one proximal point, that is, one point of interaction between the sample and the probe tip.

Referring now to FIGS. 3A and 3B, illustrated are elevational views of probative portions 311, 321 of conventional cylindrical and conical probes 310, 320, respectively, for a stylus nanoprofilometer. In the early 1990's, cylindrical and conical probe tips could be made by chemically etching a single strand of optic fiber to form a terminus width 312 of about 500 nm with a length 313 of about 1000 nm. At the time, these probe tip dimensions and the cylindrical or elongated conical shapes 311, 321 were adequate for the topologies of semiconductor features then being formed.

In everyday life physical measurement with tools, e.g., dial indicators, thickness calipers, etc., employing a tapered probe tip is very common. Accordingly, one might believe that a conical probe tip only interacts with an intended surface 330 at the very extreme end or terminus 314, 324 of the tip 310, 320, respectively. Of course, when working in sub-200 nm dimensions, one who is skilled in the art will readily understand that it may be, for all practical purposes, impossible to shape a terminus 314, 324 on the order of 1 nm in width. Therefore, the terminus 314, 324 must realistically have some finite thickness.

For critical dimension measurements, the shape of the probe tip 311, 321 must be extracted from the obtained scan data. With a conventional probe tip 311, 321, surface features 340 that are small in relation to the probe tip 311, 321 "reflect" the probe tip 311, 321. That is, as the probe 310, 320 moves along from left to right, a relatively large probe tip 311, 321 contacts the feature 340 at multiple times, e.g., contact points 371, 372, 373, and 381, 382, 383, respectively, thereby reflecting the shape of the tip 310, 320. Therefore, probe tips 311, 321 must be made so that they are easily characterized and have only one proximal point, i.e., one point of interaction between the sample and the tip. Of course, as FIGS. 3A and 3B show, the tips 311, 321 actually have several proximal points 371, 372, 373 and 381, 382, 383, respectively.

Referring now to FIG. 4, illustrated is a conventional conical probe tip 410 in relation to a sectional view of a semiconductor feature 400 of high aspect ratio. Although the reflection effect of the conical tip is significantly less than the cylindrical tip, it may not always be possible to ascertain the presence or absence of material near the sidewall of a feature with a conventional conical probe. For example, it is extremely important to know if all of a photoresist layer, e.g., 421, 422, has been removed during a stripping process. When the conical probe tip 410 with a positive sidewall angle 415, i.e., a tip with a conventional conical point, encounters small features of high aspect ratio, the sidewall angle 415 of the probe tip 410 limits the ability to obtain data from areas 431, 432. This occurs because a tip surface 412 encounters a corner 401 of the tip 410 first. Because of the high aspect ratio of the feature 400, photoresist material may still be present in the areas 421, 422 deep in the feature 400.

Accordingly, what is needed in the art is a non-destructive measurement system for semiconductor features that avoids the limitations of the aforementioned measurement systems.

SUMMARY OF THE INVENTION

To address the above-discussed deficiencies of the prior art, the present invention provides an apparatus and a method of manufacturing that apparatus. More specifically, to a method of manufacturing probes for a stylus nanoprofilometer having a non-circular probe tip geometry and a method of measurement of semiconductor wafer features using the same. In one embodiment, the probe comprises an upper portion couplable to the stylus nanoprofilometer and a probative portion coupled to the upper portion. The probative portion has a cross section that is substantially thinner than a cross section of the upper portion. The probative portion further has a terminus distal the upper portion and a reentrant angle from the terminus to the upper portion.

In another embodiment, the probe further comprises a transition region interposed between the upper portion and the probative portion. The probe, in one advantageous embodiment, has an upper portion cross section that is circular and a probative portion cross section that is preferably polygonal and more preferably is quadrate. In such embodiments, the opposing diagonal corners of the quadrate terminus are used to sense surface points. In other embodiments, where the polygonal is of another geometrical shape, similar opposing corners could be used to sense surface points.

In an alternative embodiment, the upper portion cross section has a diameter of about $2.5 \times 10^5$ nm and the probative portion cross section has a thickness of about 150 nm. In another preferred aspect, the probe has a reentrant angle that is about 1°. In a further aspect, for quartz, the probative portion has an aspect ratio of about 6.25. However the aspect ratio will change with the material used for the probative portion. In one embodiment, the probe comprises a quartz optic fiber that is subjected to a first wet chemical etch to form a conical topography and to reduce the overall dimensions of the optic fiber. Then a focused ion beam is used to further shape the optic fiber such that it has the desired reentrant angle and aspect ratio. The fiber is then subjected to a second chemical wet etch to reduce the overall dimensions of the shaped fiber to a size suitable for imaging a sub-0.25 micron semiconductor feature.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which:

FIG. 5A illustrates an elevational view of a single cylindrical optic fiber while being subjected to a first chemical etchant;

FIG. 5B illustrates an elevational view of the cylindrical optic fiber of FIG. 5A after etching;

FIG. 6 illustrates solution chemistries for two formulations for the first chemical etchant;

FIG. 10A illustrates an elevational view of the probe of FIG. 9 being subjected to a second oxide etch;

FIG. 10B illustrates a sectional view of a semiconductor feature for measurement by the probe of FIG. 10A;

FIG. 11 illustrates four unique second etching chemistries used to reduce the adverse effects of the FIB process and to further reduce the overall dimensions of the probative portion;

FIG. 13 illustrates an elevational view of the probe of FIG. 11 in relation to a sectional view of the semiconductor feature of FIG. 1;

DETAILED DESCRIPTION

Figure 1:
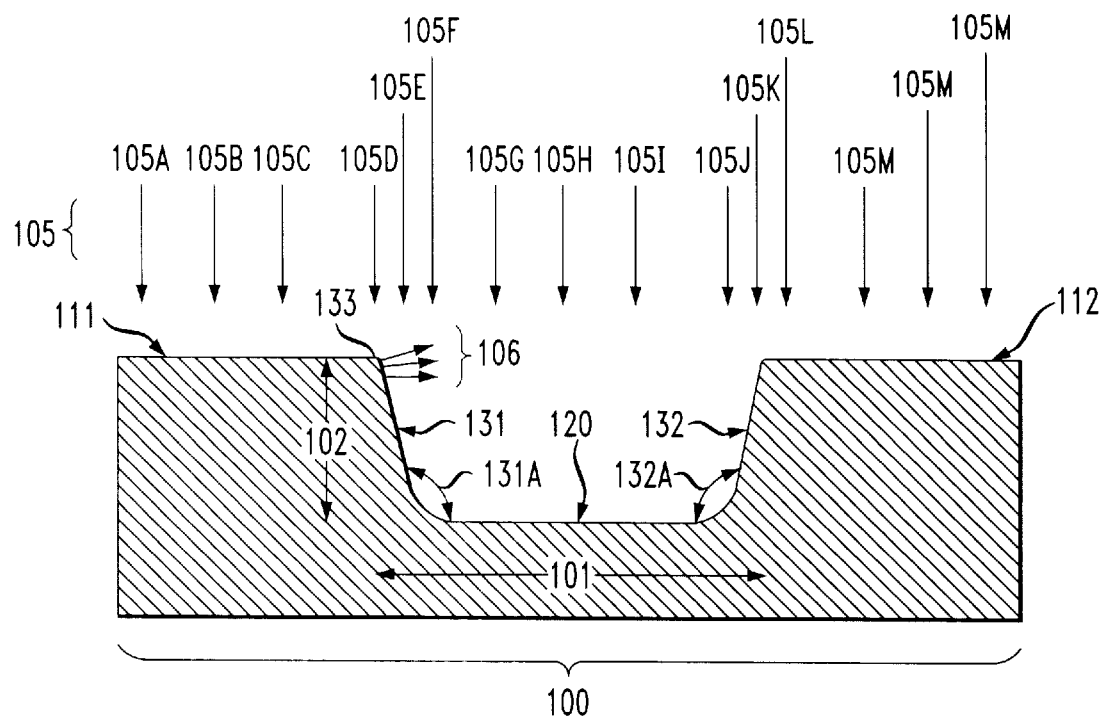
FIG. 1 illustrates a sectional view of one embodiment of a simple semiconductor wafer feature being subjected to a vertical electron beam of a SEM.
Figure 2:
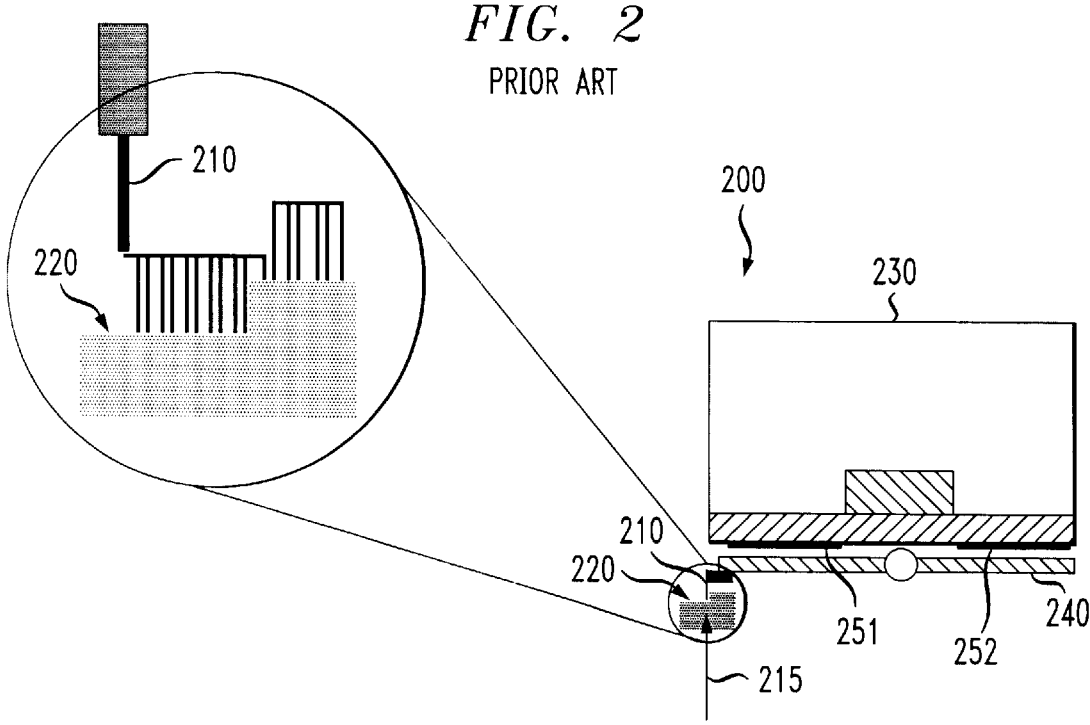
FIG. 2 illustrates a schematic representation of a conventional, single-direction balance beam force sensor.
Figure 3A:
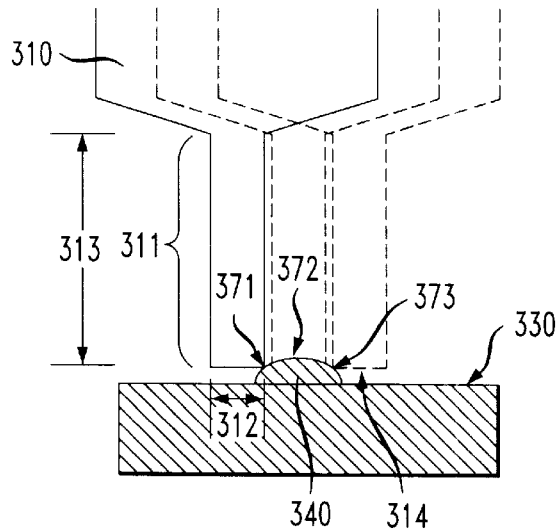
FIG. 3A illustrates an elevational view of a probative portion of a conventional cylindrical probe for a stylus nanoprofilometer.
Figure 3B:
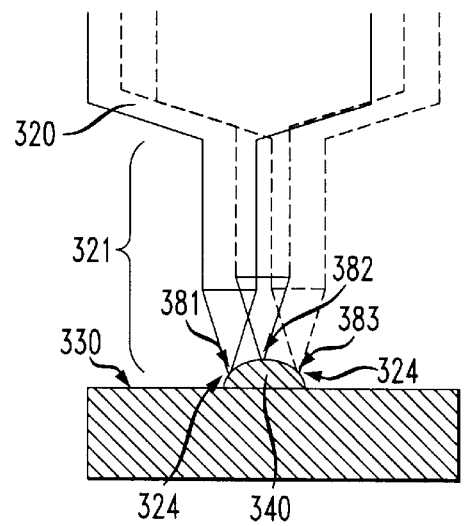
FIG. 3B illustrates an elevational view of a probative portion of a conventional conical probe for a stylus nanoprofilometer.

Referring now to FIGS. 5A and 5B, illustrated is an elevational view of a single, cylindrical optic fiber 500 being subjected to a first chemical etchant 510 (FIG. 5A), which results in the etched fiber 502 as illustrated in FIG. 5B. In a preferred embodiment, the cylindrical fiber 500 may be comprised of isotropic, pure silica core quartz having an initial diameter 520 of $2.5 \times 10^5$ nm and a longitudinal axis 501. However, other non-quartz materials may also be used in place of the quartz optical fiber. Commercially available quartz optical fiber is readily available with a diameter of $2.5 \times 10^5$ nm with a quality assurance standard of ±1000 nm. Isotropy, in this instance, is the property of the material to etch at the same uniform rate in all axes when subjected to a chemical etchant.

The first chemical etchant 510 may comprise a basic oxide etchant plus hydrofluoric acid and acetic acid. In parts by volume, the basic oxide etchant (BOE) may comprise, for example:

615 parts ammonium fluoride ($NH_4F$), 104 parts hydrofluoric acid (HF) (49%), and 62 parts deionized water ($H_2O$).

Solution chemistries for two formulations, Solution A and Solution B, for the first chemical etchant are shown in FIG. 6. Of course, various formulations may be employed with varying results, i.e., the rate of etch may be controlled by the etchant formulation and concentration. Solutions A and B are etching chemistries that are applicable when the fiber 500 is quartz. In those embodiments where the fiber 500 is comprised of a non-quartz material, etching chemistries appropriate for those materials should be used. Formulations A and B have been successfully used to complete the first chemical etch of the optic fiber 500. In the case of Solution B, a typical fast radial etch rate of 45 nm/sec has been achieved.

When the fiber 500 is placed in the etchant solution 510, a meniscus 503 forms about the fiber 500. As a function of the concentration of the etchant, thicker etchant causes more extensive etching. Therefore, in area 511, where the etchant is thinner, less chemical action occurs, while in area 512, where the etchant is thicker, more etching action occurs, resulting in a morphology that is a frustum of a cone as indicated by surface 502. Thus, the result of the first chemical etch is a tapered conical shape 502 about axis 501 having a base diameter 530 of about 1000 nm and a frustum tip diameter 540 of about 900 nm with a length 550 of the tapered conical shape 502 of about 1000 nm. The tapered conical shape 502 may also be referred to as a probative portion 502. As a result, a main portion 560 of the optic fiber 500 not etched by the etchant 510 may now be referred to as a probe body 560. A transition region 570 may also form as the etching occurs because the etching process does not necessarily form a perfectly flat surface at the juncture 571 of the probe body 560 and the probative portion 502. One who is skilled in the art will readily recognize that the etching process may also be continued until the probative portion 502 has been etched away to a point (not shown).

Figure 7A:
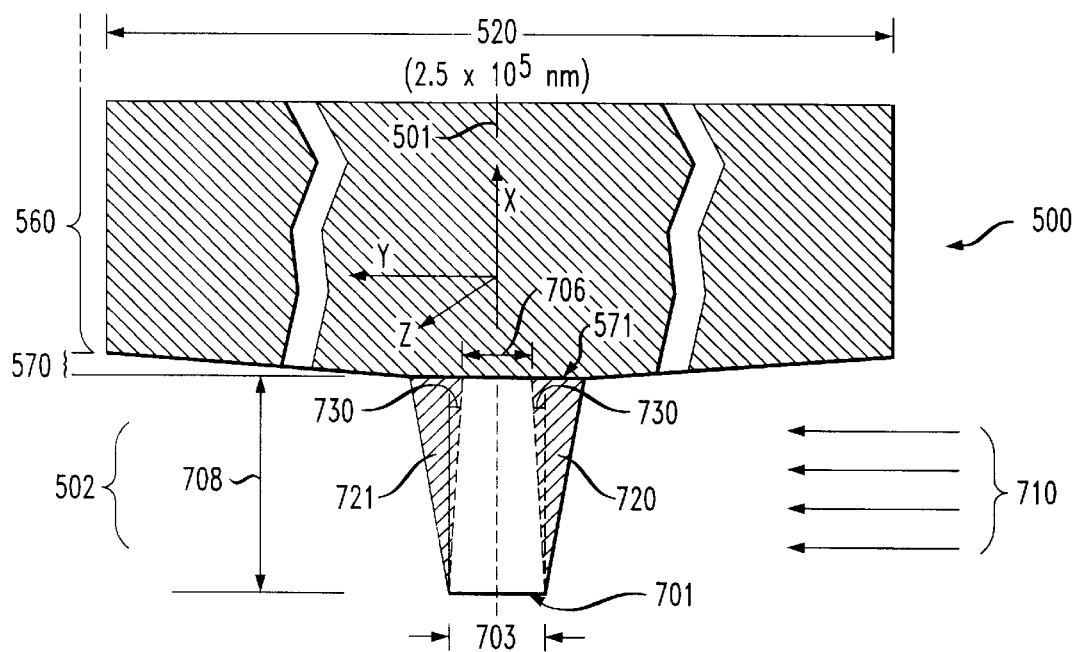
FIGS. 7A and 7B illustrate elevational and end views, respectively, of the optical fiber of FIG. 5 indicating areas to be removed with a focused ion beam.
Figure 7B:
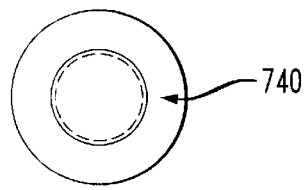

Referring now to FIGS. 7A and 7B, illustrated are elevational and end views, respectively, of the optical fiber 500 of FIG. 5 indicating areas 720, 721 to be removed with a focused ion beam (FIB) 710. In one embodiment, the FIB 710 may be a gallium FIB. Of course, FIBs using other suitable elements may also be used.

For illustrative purposes, a representative axis system is shown as X- and Y-axes in the plane of FIG. 7A, with the Z-axis extending out of FIG. 7A, as shown. The fiber longitudinal axis 501 is coincident with the X-axis, and the FIB 710 is parallel with the Y-axis as shown. The FIB 710 is aligned with the optical fiber 500 normal to, but offset from, the longitudinal axis 501 along the z-axis. The offset allows the FIB 710 to use ion beam removal of side walls 720, 721 of the fiber 500 with an emphasis on creating a reentrant angle 730 from a terminus 701 of the fiber 500 back to the juncture 571.

In one embodiment, the fiber 500 may be rotated about its longitudinal axis 501 while being subjected to the FIB 710, resulting in a circular cross section 740 as shown in end view FIG. 7B. The FIB 710 is capable of producing feature (tip morphology) carving of 5 to 7 nm in size. The fiber 500 is carved with the FIB 710 to form the reentrant angle 730 so that the terminus 701 maintains a diameter 703 of about 900 nm. Meanwhile a diameter 706 of the probative portion 502 at the juncture 571 is reduced to about 760 nm at a distance 708 of about 1000 nm from the terminus 701. Thus, the probative portion 502 has a length 708 of about 1000 nm and a terminus diameter of about 900 nm. The transition region 570 may vary somewhat in morphology as the probative portion 502 is formed by the first chemical etch 510 and shaping with the FIB 710. One should take special note of dimensions 703, 706, 708 as compared to the diameter 520 of the fiber 500 shown as $2.5 \times 10^5$ nm for an indication of their relative size.

Figure 7C:
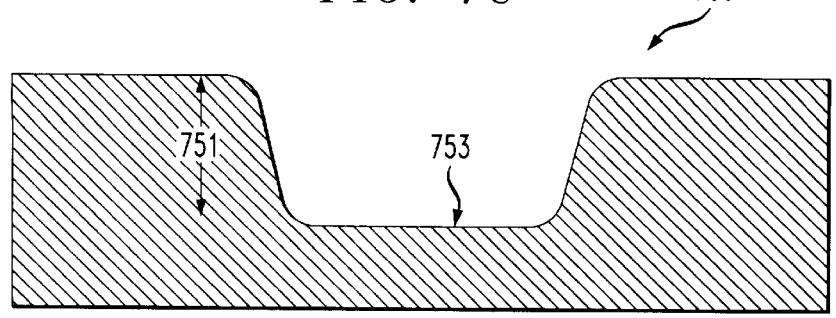
FIG. 7C illustrated a sectional view of a representative semiconductor feature to be examined with the probe of FIGS. 7A and 7B.

Referring now to FIG. 7C, with continuing reference to FIGS. 7A and 7B, illustrated is a sectional view of a representative semiconductor feature to be examined with the probe of FIGS. 7A and 7B. The length 708 of the probative portion 502 must be longer than an anticipated depth 751 of a feature 750 to be examined in order to allow the terminus 701 to reach a bottom surface 753 of the feature 750. The topography of the probative portion 740 may be referred to as a frustum of a right circular cone. It should be specifically understood that the above discussed FIB technique can be used in conjunction with etching chemistries described herein or can be used without such etching chemistries to achieve the desired morphology of the fiber 500.

Figure 7D:
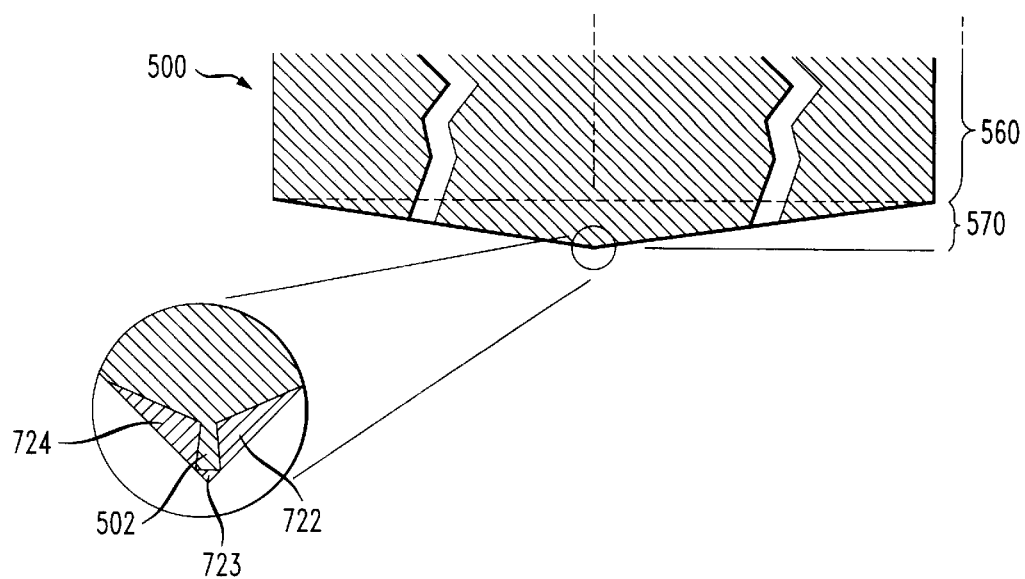
FIG. 7D illustrates elevational and enlarged views of an alternative embodiment of the optical fiber of FIG. 5 indicating an alternative manner of shaping the probative portion with a focused ion beam.

Referring now to FIG. 7D, illustrated are elevational and enlarged views of an alternative embodiment of the optical fiber 500 of FIG. 5 indicating an alternative manner of shaping the probative portion with a focused ion beam (FIB) 710. In this embodiment, the first etching has proceeded until only a transition region 570 remains. Using the FIB 710 as described above, a probative portion 502 may be formed from the transition region 570 by removing areas 722, 723, 724 as shown in the enlarged view.

Figure 8A:
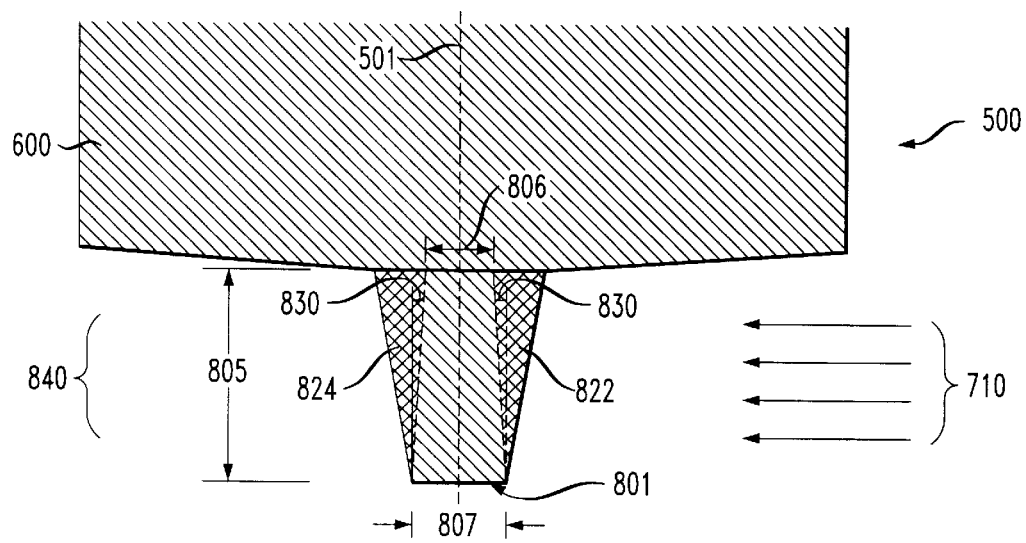
FIGS. 8A and 8B illustrate elevational and end views, respectively, of an alternative embodiment of the optical fiber of FIGS. 7A and 7B indicating areas to be removed with a focused ion beam.
Figure 8B:
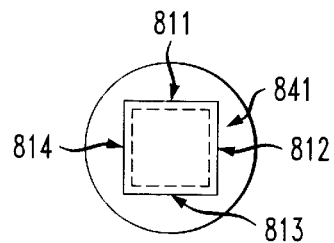

Referring now to FIGS. 8A and 8B, illustrated are elevational and end views of an alternative embodiment of the optical fiber 500 of FIGS. 7A and 7B indicating areas to be removed with the focused ion beam (FIB) 710. In this preferred embodiment, the fiber 500 is rotated in increments of 90 degrees about the longitudinal axis 501, removing portions 821–824 (only 822 and 824 visible). Thus, a faceted, probative portion 840 may be created with an essentially tapering, polygonal cross section 841 as shown. In the illustrated embodiment, the polygonal cross section 841 is quadrate. However, the probative portion 840 may also be shaped with the FIB 810 to other geometrical sectional shapes, e.g., hexagonal, octagonal, etc. Such other sectional shapes may be employed to add strength to the probative portion 840.

A reentrant angle 830 of about 1° has been formed on each face 811–814 of the faceted probative portion 840 with the FIB 810. In one configuration, the shape of the probative portion 840 may be referred to as a frustum of a right quadrate pyramid. The FIB 810 is also used to establish an aspect ratio of a length 805 to a width 807 at a terminus 801 of the probative portion 840. The aspect ratio is of significant importance because the deflection D of the probative portion 840 is a direct function of the Young's modulus Y of the material times the length l to the third power and inversely proportional to the radius r (width 807/2) to the fourth power, i.e., $D\ Yl^3/r^4$. Thus, in order to have a probative portion 840 that does not deflect unduly, the aspect ratio must be controlled.

Figure 9:
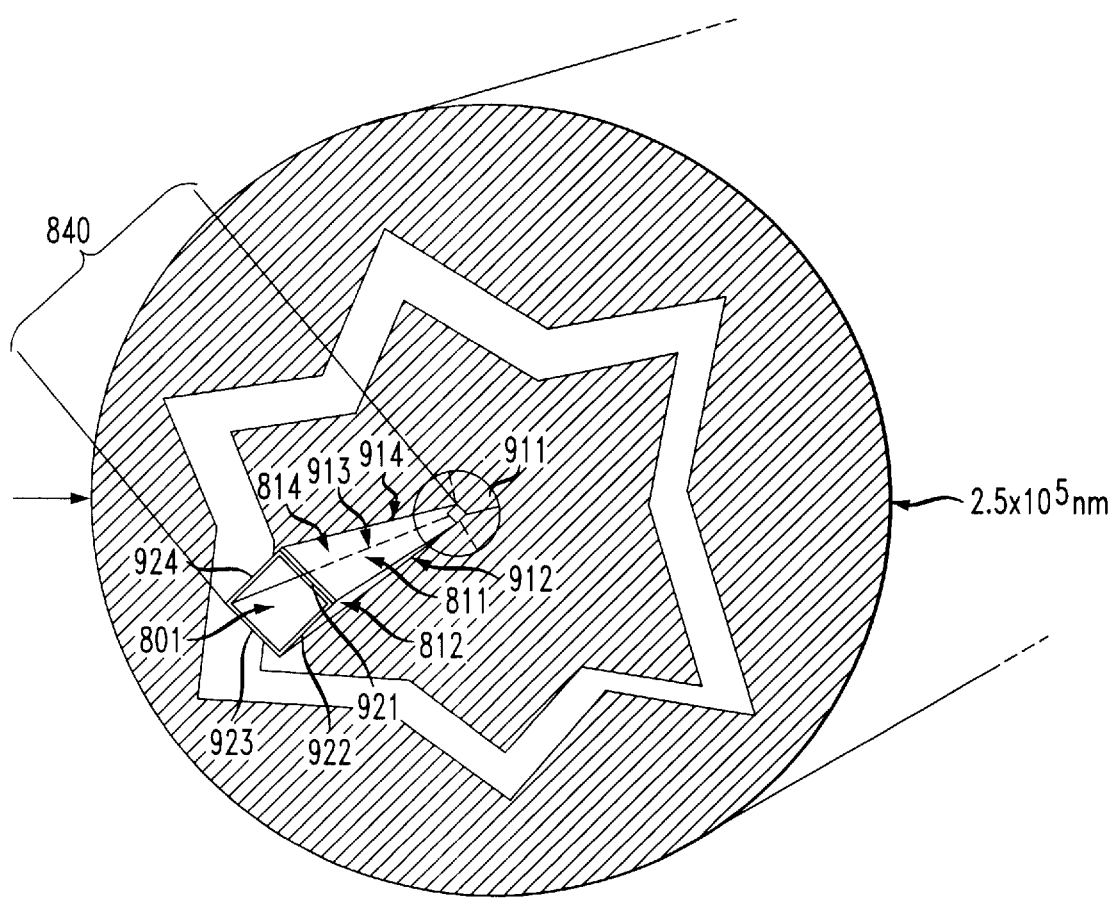
FIG. 9 illustrates an isometric view of the optical fiber of FIGS. 8A and 8B.

Referring now to FIG. 9 with continuing reference to FIGS. 8A and 8B, illustrated is an isometric view of the optical fiber of FIGS. 8A and 8B. While the FIB 810 is used to establish the aspect ratio, certain damage occurs as a result of the nature of the FIB 810. During FIB shaping, fiber edges 911–914 undergo more erosion than fiber surfaces 811–814. Therefore, terminus edge areas 921–924 are also adversely affected by the FIB 810. Also, when the FIB 810 uses gallium ions, the gallium ions may adhere to the surfaces 811–814 (813 not readily discernable) of the probative portion 840. As gallium is also used as a dopant, a probative portion 840 contaminated with gallium ions should not be allowed to contact a surface of a semiconductor die. Thus, in this particular embodiment, the probative portion 840 is subjected to a unique second etching chemistry that removes a sufficient amount of the surfaces 811–814 to reduce the adverse effects of the FIB process and to further reduce the overall dimensions of the probative portion 840 for reasons discussed below.

Referring now to FIG. 10A with continuing reference to FIG. 9, illustrated is an elevational view of the probe 500 of FIG. 9 being subjected to a second oxide etch 1010. Because of the isotropic property of the quartz, the second chemical etch 1010 removes optic fiber material 1020 in an essentially uniform manner from the surfaces 811–814 of the probative portion 840. Pre-etch surfaces 1021–1024 (not all visible) indicate the shape prior to etching. Post-etch surfaces 1031–1034 (not all visible) indicate the shape after etching. The second chemical etch 1010 also eliminates any gallium contamination on the probe surfaces 811–814, while reducing the sectional properties by a factor of about 5. Material is etched from about 860 nm and 900 nm 1041, 1042, respectively, down to about 150 nm and 160 nm 1051, 1052, respectively. Because of the isotropic property of the quartz crystal, the aspect ratio of the probative portion 840 is maintained during the etch. That is, a ratio of the length 805 to the thickness 1042, pre-etch, is maintained in the post-etch configuration, i.e., length 1005 to thickness 1052. Therefore, the aspect ratio and reentrant angle is set by the FIB, and maintained by the second chemical etch 1010 while thinning the probative portion 840 from about 900 nm 1042 to about 160 nm 1052. In a particularly advantageous embodiment, the aspect ratio is about 6.25.

Referring now to FIG. 10B with continuing reference to FIG. 10A, illustrated is a sectional view of a semiconductor feature 1060 for measurement by the probe 500 of FIG. 10A. It should be noted that the finished length 1005 of the probative portion 840 is chosen to be slightly longer than an anticipated depth 1061 of the feature 1060 to be measured as explained in FIG. 7C. Likewise, the finished thickness 1052 of the probative portion 840 must be less than an anticipated inter-feature spacing 1062 so that the probative portion 840 may fit between the features.

Referring now to FIG. 11, illustrated are four unique second etching chemistries used to reduce the adverse effects of the FIB process and to further reduce the overall dimensions of the probative portion 840. The etch rates of Solutions C through F are considerably slower than those of Solutions A and B of FIG. 6. For example, Solution D is known to exhibit an etch rate of about 2.25 nm/sec. Solutions C through F are not conventional quartz etching chemistries and are directed specifically to the second etching step to further shape the fiber 500 as discussed above.

Figure 12:
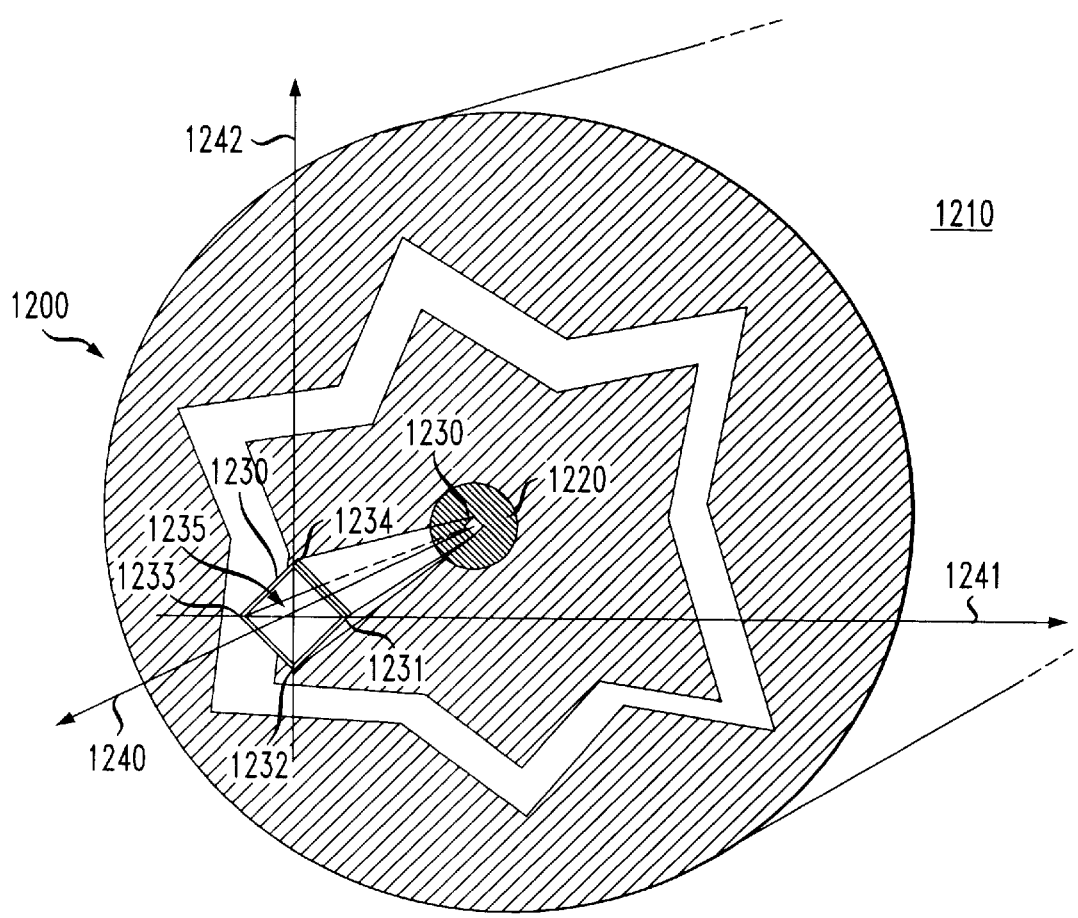
FIG. 12 illustrates an isometric view of a finished probe tip constructed according to the principles of the present invention

Referring now to FIG. 12, illustrated is an isometric view of a finished probe tip 1200 constructed according to the principles of the present invention. The probe tip 1200 comprises a relatively thick upper cylindrical portion 1210, a transition region 1220, and a probative portion 1230. The probative portion 1230 has the shape of a frustum of a right quadrate pyramid. A base 1235 of the right quadrate pyramid 1230 is also the terminus 1235 of the probative portion 1230 and has four corners 1231–1234. The probe tip 1200 further comprises a longitudinal axis 1240 and first and second operational axes 1241, 1242. The first and second operational axes 1241, 1242 are orthogonal and oriented through the corners 1221–1224 as shown. The first and second operational axes 1241, 1242 correspond to x- and y-axes of operation of a SNP. This positions the corners 1231 and 1233 as the proximal points for sensing the feature's surface.

Figure 13A:
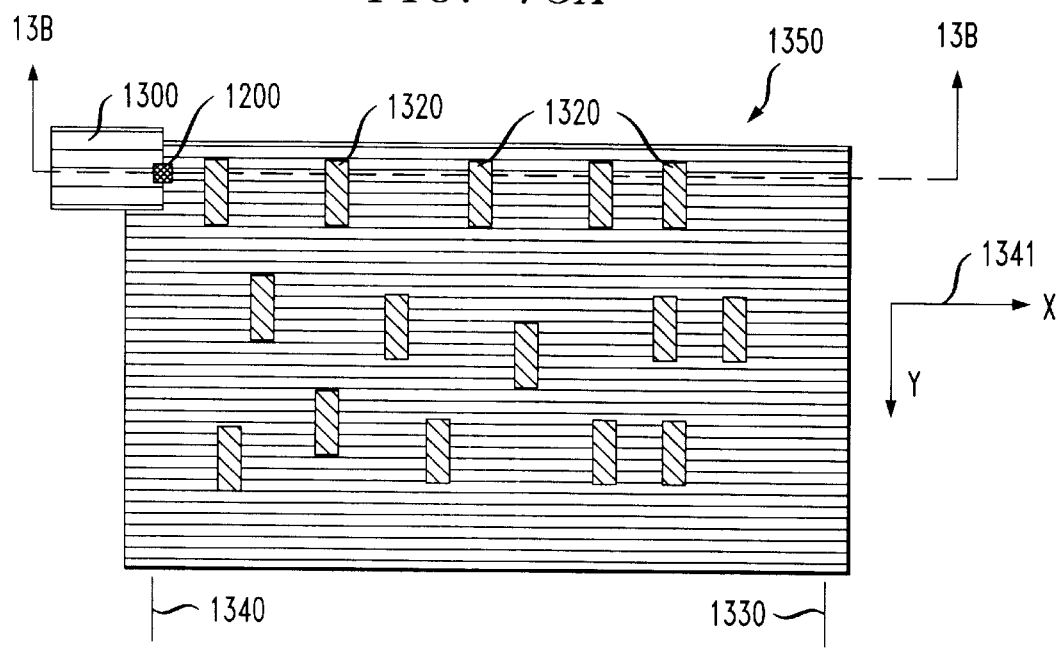
FIGS. 13A and 13B illustrate plan and sectional views, respectively, of a stylus nanoprofilometer using the probe tip of FIG. 12.
Figure 13B:
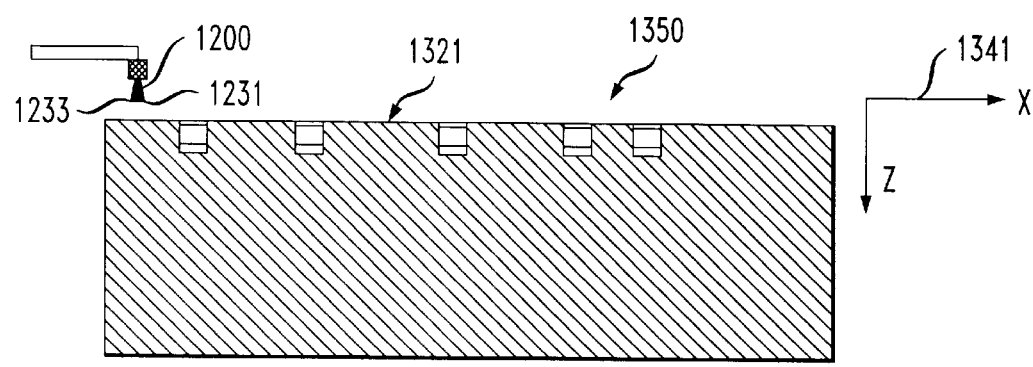

Referring now to FIGS. 13A and 13B with continuing reference to FIG. 12, illustrated are plan and sectional views, respectively, of a stylus nanoprofilometer 1300 using the probe tip 1200 of FIG. 12. The stylus nanoprofilometer 1300 and probe tip 1200 are shown in relation to semiconductor features, collectively designated 1320. The probe tip 1200, driven by the SNP 1300, initially tracks along a first operational axis 1341 that may also be termed a fast scan axis 1341 of a semiconductor device 1350. At each incremental positioning, the probe tip 1200 is extended to contact the feature's surface 1321, and the x, y, and z coordinates of the surface 1321 are recorded. In this fast scan mode, corner 1231 is used to ascertain the location of each surface 1321 point. The probe 1200 is then retracted, and the SNP 1300 is incremented in the +X direction 1241. Upon reaching a right limit 1330 of the semiconductor device 1350, the probe tip 1200 is incremented once in the +Y direction. Direction of sensing may then be reversed to the −X direction and corner 1133 used to ascertain the location of each surface point 1321 while traversing right to left. Upon reaching a left limit 1340 of the semiconductor device 1350, the probe tip 1200 is incremented again in the +Y direction. This process repeats until the entire surface has been mapped. The thickness of the probe 1200, i.e., the distance between corners 1231 and 1233, can readily be eliminated from the mapping of the surface by computation. Alternatively, the SNP may be reset to the left limit 1340 after reaching the right limit 1330, and the sensing performed solely with corner 1231.

Figure 4:
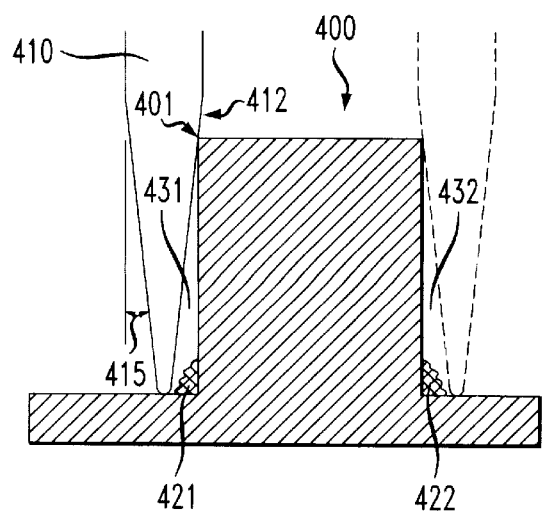
FIG. 4 illustrates a conventional conical probe tip in relation to a sectional view of a semiconductor feature of high aspect ratio.
Figure 14:
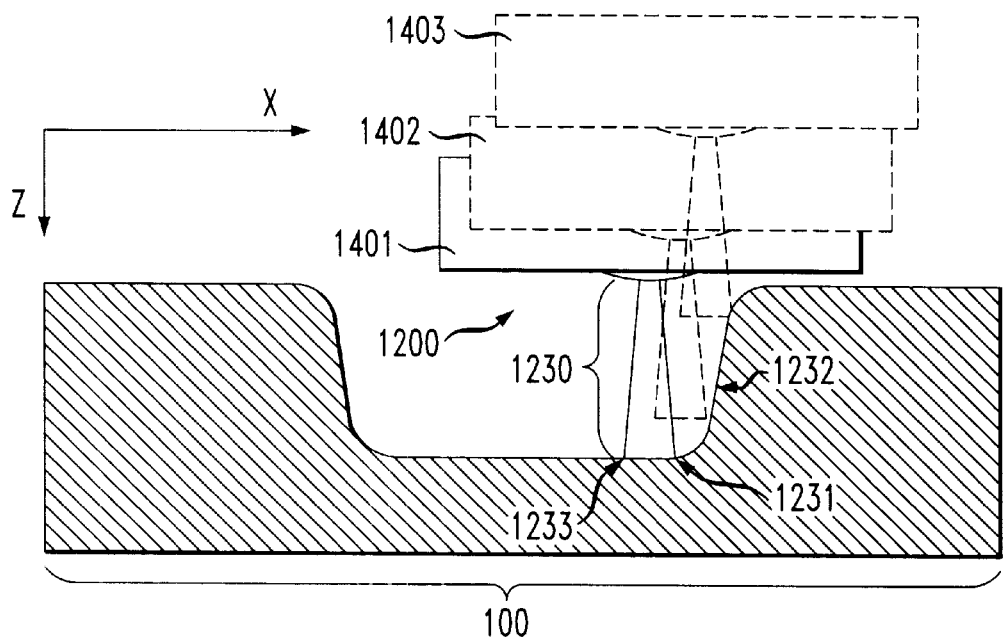
FIG. 14 illustrates an elevational view of the probe tip of FIG. 12 in relation to a sectional view of the semiconductor feature of FIG. 1.

Referring now to FIG. 14, illustrated is an elevational view of the probe tip 1200 of FIG. 12 in relation to a sectional view of the semiconductor feature 100 of FIG. 1. The X- and Z-axes are as shown. As can be seen by the positions 1401, 1402, 1403 of the probative portion 1230 in relation to the second side 132, it should be clear to those who are skilled in the art that when using the present invention, the SNP has a single proximal point 1231 when operating in the +X axis. Therefore, the limitation on defining the second side 132 is the size of the increment in the +X direction. Likewise, when the probe 1200 is being operated in the −X direction, the proximal point becomes 1233. The distance between the first and second proximal points 1231, 1233 may be readily determined, and compensation for the difference in their positions made in the final computation of the surface map. The probative portion 1230 effectively reaches into previously lost data areas 421, 422 of FIG. 4 because of the combination of the unique, quadrate cross section, and probe 1200 orientation. Thus the sloping nature of sidewalls 131, 132 of the feature 100 are efficiently mapped.

Figure 15:
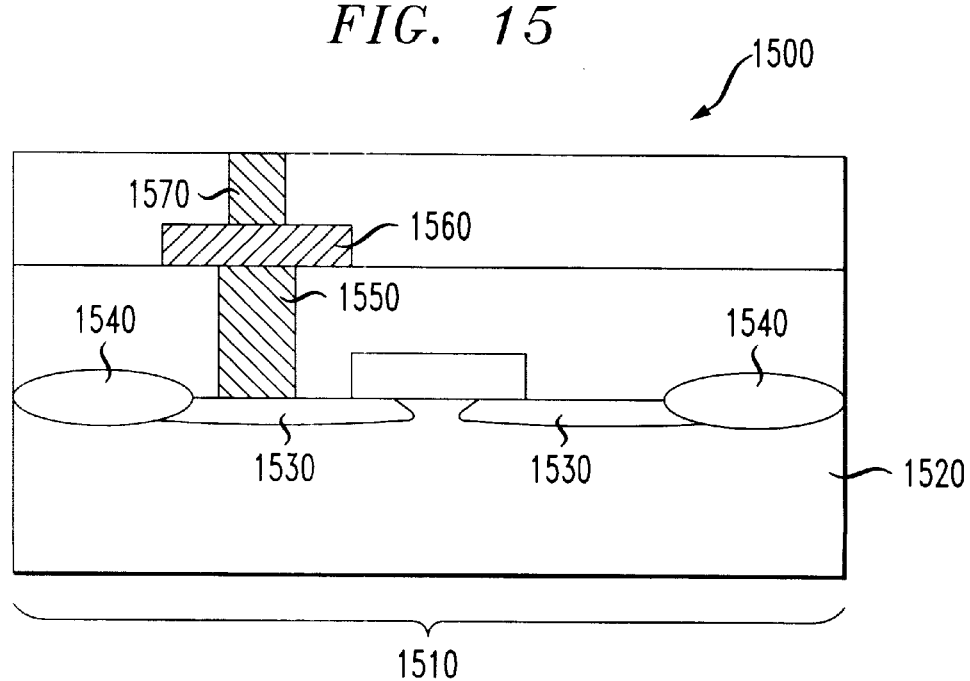
FIG. 15 illustrates a partial sectional view of a conventional integrated circuit that can be manufactured using the described invention.

Based on the foregoing discussion, it can readily be seen that the apparatus and method provided by the present invention can be used to improve the manufacturing of a conventional integrated circuit, which is illustrated in FIG. 15. FIG. 15 is a partial sectional view of a conventional integrated circuit 1500. In this particular sectional view, there is illustrated an active device 1510 that comprises a tub region 1520, source/drain regions 1530 and field oxides 1540, which together may form a conventional transistor, such as a CMOS, PMOS, NMOS or bi-polar transistor. A contact plug 1550 contacts the active device 1510. The contact plug 1550 is, in turn, contacted by a trace 1560 that connects to other regions of the integrated circuit, which are not shown. A VIA 1570 contacts the trace 1560, which provides electrical connection to subsequent levels of the integrated circuit 1500. At any stage in the manufacture of the integrated circuit 1500, an SNP equipped with the presently described invention may be used to map a surface of the integrated circuit 1500. As a consequence, a more accurate understanding of the precise nature of the integrated circuit, e.g. residual photomask, etc., may be obtained. Therefore, the intervening processes may be modified as required to form the proper components as desired. This, in turn, provides for an overall improved integrated circuit 1500.

Thus, a probe for a stylus nanoprofilometer has been described that provides selectable, alternative proximal points for precisely measuring sub-250 nm features of a semiconductor device. The described invention avoids common pitfalls of conventional measuring equipment such as surface interaction, and blooming effects evident in a scanning electron microscope.

Although the present invention has been described in detail, those skilled in the art should understand that they can make various changes, substitutions and alterations herein without departing from the spirit and scope of the invention in its broadest form.

What is claimed is:

1. A method of mapping a surface of a semiconductor device with a stylus nanoprofilometer, comprising:
  mounting a probe in the stylus nanoprofilometer, the probe comprising:
    an upper portion couplable to a stylus nanoprofilometer; and
    a probative portion coupled to the upper portion and having a cross section that is substantially thinner than each cross section of the upper portion, the probative portion further having a predetermined length defined by a distal end coupled to the Lipper portion, and a terminus, the probative portion being tapered along the length such that a cross section at any point along the length is wider than a cross section of the distal end;
  contacting a surface of the semiconductor device with the terminus;
  recording dimensional coordinates of the terminus; and
  incrementing the probe in a first planar direction.

2. The method as recited in claim 1 wherein mounting includes mounting a probe having a polygonal cross section at the terminus.

3. The method as recited in claim 2 wherein:
  mounting includes mounting a probe having a quadrate cross section at a terminus thereof, the quadrate cross section having:

a first orthogonal axis intersecting first and third opposing corners of the quadrate cross section, the first orthogonal axis parallel the first planar direction; and a second orthogonal axis intersecting second and fourth opposing corners of the quadrate cross section; and contacting includes contacting with the first opposing corner.

4. The method as recited in claim 3 further comprising:

repeating the extending, the recording, the retracting and the incrementing until reaching a reversal point of the semiconductor device;

incrementing the probe in a second planar direction normal the first planar direction; and contacting includes contacting with the third opposing corner.

5. A method of manufacturing an integrated circuit, comprising:

forming a feature on a semiconductor wafer;

measuring the feature with a stylus nanoprofilometer having a probe, the probe comprising:
   an upper portion couplable to the stylus nanoprofilometer; and
   a probative portion coupled to the upper portion and having a cross section that is substantially thinner than each cross section of the upper portion, the probative portion further having a predetermined length defined by a distal end coupled to the upper portion, and a terminus, the probative portion being tapered along the length such that a cross section at any point along the length is wider than a cross section of the distal end;

contacting a surface of the semiconductor device with the terminus;

recording dimensional coordinates of the terminus; and incrementing the probe in a first planar direction.

6. The method as recited in claim 5 wherein measuring includes measuring with a probe having a polygonal cross section at the terminus.

7. The method as recited in claim 6 wherein:

measuring includes measuring with a probe having a quadrate cross section at the terminus, the quadrate cross section having:
   a first orthogonal axis intersecting first and third opposing corners of the quadrate cross section, the first orthogonal axis parallel the first planar direction; and
   a second orthogonal axis intersecting second and fourth opposing corners of the quadrate cross section; and contacting includes contacting with the first opposing corner.

8. The method as recited in claim 6 further comprising:

repeating the extending, the recording, the retracting and the incrementing until reaching a reversal point of the semiconductor device;

incrementing the probe in a second planar direction normal the first planar direction; and contacting includes contacting with the third opposing corner.

9. An integrated circuit as made by the method recited in claim 5.

10. The integrated circuit as recited in claim 9 wherein the integrated circuit includes a transistor selected from the group consisting of:

a CMOS transistor;

an NMOS transistor;

a PMOS transistor; and a bipolar transistor.

11. The integrated circuit as recited in claim 9 further comprising electrical interconnects formed within the integrated circuit.

12. The integrated circuit as recited in claim 11 wherein the electrical interconnects include an electrical interconnect selected from the group consisting of:

a contact plug;

a VIA; and a trace.

\* \* \* \* \*